US012744539B2

(12) United States Patent
Jang et al.

(10) Patent No.: US 12,744,539 B2
(45) Date of Patent: Sep. 22, 2026

(54) PHASE LOCKED LOOP CIRCUIT AND METHOD OF OPERATION THEREOF

(71) Applicant: SAMSUNG ELECTRONICS CO., LTD., Suwon-si (KR)

(72) Inventors: Dohun Jang, Suwon-si (KR); Junhyeok Yang, Suwon-si (KR); Hyuntaek Oh, Suwon-si (KR); Dokyung Lim, Suwon-si (KR); Chanyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/804,954

(22) Filed: Aug. 14, 2024

(65) Prior Publication Data

US 2025/0062771 A1 Feb. 20, 2025

(30) Foreign Application Priority Data

Aug. 14, 2023 (KR) ........................ 10-2023-0106419

(51) Int. Cl.
*H03L 7/10* (2006.01)
*H03L 7/089* (2006.01)
(Continued)

(52) U.S. Cl.
CPC .......... *H03L 7/1077* (2013.01); *H03L 7/0891* (2013.01); *H03L 7/095* (2013.01); *H03L 7/1075* (2013.01)

(58) Field of Classification Search
CPC ..... H03L 7/1077; H03L 7/0891; H03L 7/095; H03L 7/1075
See application file for complete search history.

(56) References Cited

U.S. PATENT DOCUMENTS 6,097,227 A 8/2000 Hayashi
7,548,122 B1 6/2009 Groe et al.
(Continued)

FOREIGN PATENT DOCUMENTS

CN 107911112 A 4/2018
CN 108242926 A 7/2018
(Continued)

OTHER PUBLICATIONS

Geng et al., "A 25.8GHz Integer-N PLL With Time-Amplifying Phase-Frequency Detector Achieving 60fsrms Jitter, -252.8dB FoMJ, and Robust Lock Acquisition Performance", ISSCC 2022, SESSION 23, Frequency Synthesizers, pp. 388-390 (3 pages total).
(Continued)

*Primary Examiner* — Daniel C Puentes
(74) *Attorney, Agent, or Firm* — Sughrue Mion, PLLC

(57) ABSTRACT

There is provided a phase locked loop circuit including a phase-frequency detection circuit configured to receive a reference clock signal and a feedback clock signal having a first phase difference from each other, adjust a phase gain based on first phase difference, and generate a first and a second control signals based on the phase gain, a lock detection circuit configured to generate a lock detection signal based on the first phase difference, a charge pump circuit configured to generate a loop filter input signal based on the first and second control signals, a loop filter configured to adjust impedance based on the activated lock detection signal and generate a loop filter output signal based on the adjusted impedance, an oscillator configured to generate a clock signal based on the loop filter output signal, and a divider configured to generate the feedback clock signal by dividing the clock signal.

20 Claims, 10 Drawing Sheets

(51) Int. Cl.
*H03L 7/095* (2006.01)
*H03L 7/107* (2006.01)

(56) References Cited

U.S. PATENT DOCUMENTS

| | | | | |
|---|---|---|---|---|
| 2007/0164829 | A1 | 7/2007 | Ko | |
| 2007/0285132 | A1* | 12/2007 | Oh | H03L 7/0898 327/3 |
| 2015/0070059 | A1* | 3/2015 | Suzuki | H03L 7/093 327/156 |

FOREIGN PATENT DOCUMENTS

| | | | |
|---|---|---|---|
| CN | 111900977 | A | 11/2020 |
| CN | 113437967 | A | 9/2021 |
| CN | 111025884 | A | 10/2021 |
| KR | 10-1996-0027347 | A | 7/1996 |
| KR | 10-2005-0007821 | A | 1/2005 |
| KR | 10-2023-0008487 | A | 1/2023 |

OTHER PUBLICATIONS

Extended European Search Report dated Jan. 2, 2025, issued by the European Patent Office in European Application No. 24193128.6.

* cited by examiner

Figure 8:
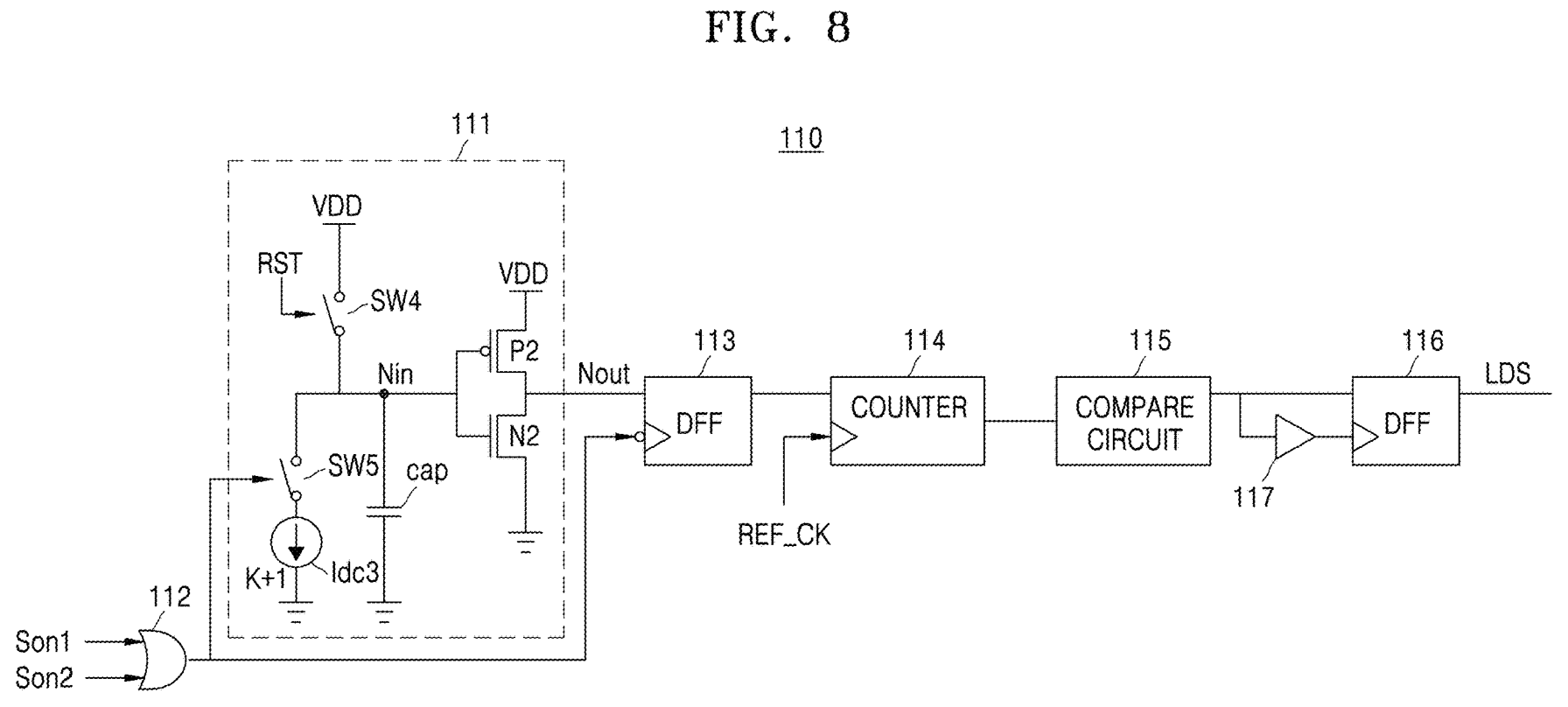

LDS
116
DFF
117
115
COMPARE CIRCUIT
114
COUNTER
REF_CK
113
DFF
Nout
111
VDD
P2
N2
SW4
Nin
cap
VDD
SW5
Idc3
RST
K+1
112
Son1
Son2

PHASE LOCKED LOOP CIRCUIT AND METHOD OF OPERATION THEREOF

CROSS-REFERENCE TO RELATED APPLICATION

This application is based on and claims priority under 35 U.S.C. § 119 to Korean Patent Application No. 10-2023-0106419, filed on Aug. 14, 2023, in the Korean Intellectual Property Office, the disclosure of which is incorporated by reference herein in its entirety.

BACKGROUND

1. Field

The disclosure relates to a phase locked loop circuit, and more particularly, to a phase locked loop circuit that controls a loop filter based on a change in phase gain, and a method of operating the phase locked loop circuit.

2. Description of Related Art

As the clock frequency of integrated circuits increases, methods to improve noise such as jitter have been researched. A phase locked loop circuit using a time-amplified phase-frequency detector may reduce in-band noise by increasing the gain of the phase-frequency detector when the phase error is small and decreasing the gain of the phase-frequency detector when the phase error is large.

SUMMARY

The disclosure relates to a phase locked loop circuit that controls a loop filter, and more particularly, to a phase locked loop circuit that reduces the lock time required to stabilize a clock signal.

According to an aspect of the disclosure, there is provided a phase locked loop circuit including: a phase-frequency detection circuit configured to: receive a reference clock signal and a feedback clock signal, adjust a phase gain based on a first phase difference between the reference clock signal and the feedback clock signal being less than a reference value, and generate a first control signal and a second control signal based on the phase gain; a lock detection circuit configured to generate a lock detection signal that is activated based on the first phase difference being less than the reference value; a charge pump circuit configured to generate a loop filter input signal by precharging an output node based on the first control signal and discharging the output node based on the second control signal; a loop filter including at least one resistor and at least one capacitor, the loop filter configured to: adjust impedance based on the activated lock detection signal, and generate a loop filter output signal by filtering the loop filter input signal based on the adjusted impedance; an oscillator configured to generate a clock signal based on the loop filter output signal; and a divider configured to generate the feedback clock signal by dividing the clock signal.

According to another aspect of the disclosure, there is provided a method of operating a phase-locked loop circuit, the method including: adjusting a phase gain based on a first phase difference between a reference clock signal and a feedback clock signal; generating a first control signal and a second control signal based on the adjusted phase gain; generating a lock detection signal based on the first phase difference, the lock detection signal being activated based on the first phase difference being less than or equal to a reference value and the lock detection signal being deactivated based on the first phase difference exceeding the reference value; generating a loop filter input signal by precharging an output node based on the first control signal and discharging the output node based on the second control signal; adjusting an impedance of a loop filter based on the lock detection signal; generating a loop filter output signal by filtering the loop filter input signal based on the adjusted impedance; and generating a clock signal based on the loop filter output signal.

According to another aspect of the disclosure, there is provided a phase locked loop circuit including: a phase-frequency detection circuit configured to: receive a reference clock signal and a feedback clock signal, adjust a phase gain based on a first phase difference between the reference clock signal and the feedback clock signal being less than a reference value, and generate a first control signal and a second control signal based on the phase gain; a lock detection circuit configured to generate a lock detection signal that is activated based on the first phase difference being less than or equal to the reference value; a charge pump circuit configured to generate a loop filter input signal by precharging an output node based on the first control signal and discharging the output node based on the second control signal; a loop filter including at least one resistor and at least one capacitor, the loop filter configured to: adjust a resistance value of the at least one resistor or a capacitance value of the at least one capacitor based on the activated lock detection signal, and generate a loop filter output signal by filtering the loop filter input signal based on the adjusted resistance value or the adjusted capacitance value; and an oscillator configured to generate a clock signal based on the loop filter output signal.

BRIEF DESCRIPTION OF DRAWINGS

Embodiments of the disclosure will be more clearly understood from the following detailed description taken in conjunction with the accompanying drawings in which:

FIG. 8 is a circuit diagram illustrating a lock detector according to an embodiment.

DETAILED DESCRIPTION

Figure 1:
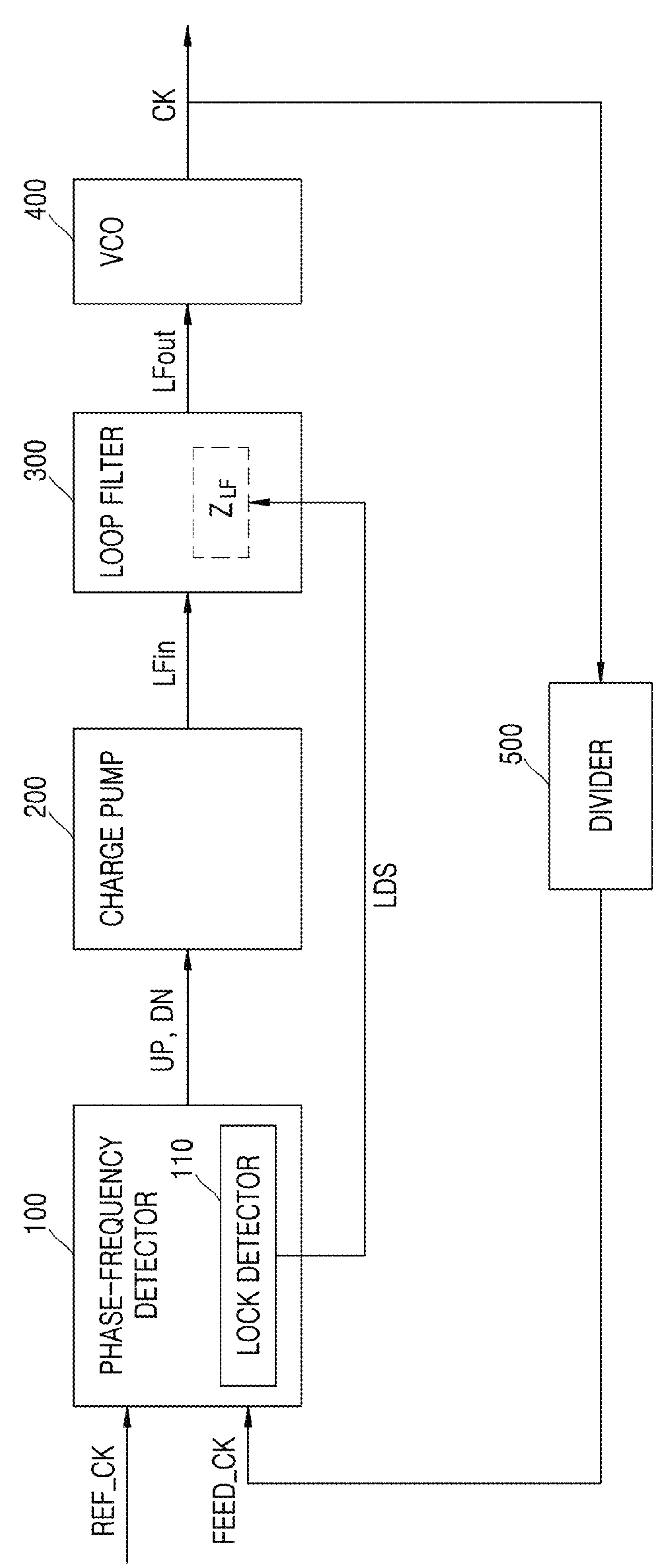
FIG. 1 is a block diagram illustrating a phase locked loop circuit according to an embodiment.

Hereinafter, various embodiments of the disclosure are described with reference to the attached drawings.

The following detailed description is provided to assist the reader in gaining a comprehensive understanding of the methods, apparatuses, and/or systems described herein.

However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all example embodiments are not limited thereto.

The embodiments of the disclosure are example embodiments, and thus, the disclosure is not limited thereto and may be realized in various other forms. As is traditional in the field, embodiments may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may be implemented by or driven by software and/or firmware (configured to perform the functions or operations described herein).

FIG. 1 is a block diagram illustrating a phase locked loop circuit (PLL) 1 according to an embodiment.

The PLL circuit 1 may receive a reference clock signal REF_CK and a feedback clock signal FEED_CK and output a clock signal CK having phase or frequency locked.

The PLL circuit 1 may include a phase-frequency detector 100, a charge pump 200, a loop filter 300, a voltage-controlled oscillator 400, and a divider 500. However, the disclosure is not limited thereto, and as such, according to another embodiment, one or more other components may be included, combined or omitted in the PLL circuit 1.

The phase-frequency detector 100 may generate an up signal UP or a down signal DN, which is a pulse with a width proportional to the phase difference between the reference clock signal REF_CK and the feedback clock signal FEED_CK. For example, when the phase of the reference clock signal REF_CK is faster than the phase of the feedback clock signal FEED_CK, the up signal UP may be activated, and as such, the phase-frequency detector 100 may generate a pulse of the up signal UP. According to an embodiment, the term "faster" may refer to the phase of the reference clock signal REF_CK occurring before the phase of the feedback clock signal FEED_CK. For instance, the phase of the reference clock signal REF_CK leads the phase of the feedback clock signal FEED_CK. The pulse width of the up signal UP may be proportional to the phase difference between the reference clock signal REF_CK and the feedback clock signal FEED_CK. In an example case in which the phase of the feedback clock signal FEED_CK is faster than the phase of the reference clock signal REF_CK, the down signal DN is activated, thereby generating a pulse of the down signal DN. The pulse width of the down signal DN may be proportional to the phase difference between the feedback clock signal FEED_CK and the reference clock signal REF_CK.

The phase-frequency detector 100 may generate an up signal UP and a down signal DN based on a first phase gain when the phase difference between the reference clock signal REF_CK and the feedback clock signal FEED_CK is greater than a reference value. The reference value may be a predetermined value. A phase gain may refer to the ratio of the phase difference between the reference clock signal REF_CK and the feedback clock signal FEED_CK and the phase difference between the up signal UP and the down signal DN. The phase difference between the reference clock signal REF_CK and the feedback clock signal FEED_CK may be referred to as the input phase difference. The phase difference between the up signal UP and the down signal DN may be referred to as the output phase difference. The phase gain may refer to the ratio of the input phase difference and the output phase difference.

The phase-frequency detector 100 may generate an up signal UP and a down signal DN based on a second phase gain when the phase difference between the reference clock signal REF_CK and the feedback clock signal FEED_CK is less than a reference value. The second phase gain may be greater than the first phase gain. That is, the phase-frequency detector 100 may generate the up signal UP and the down signal DN with an amplified output phase difference by amplifying the input phase difference more as the phase difference between the reference clock signal REF_CK and the feedback clock signal FEED_CK becomes less. Accordingly, in-band noise may be reduced.

The phase-frequency detector 100 may be referred to as a time-amplifying phase frequency detector.

The charge pump 200 may receive an up signal UP or a down signal DN and generate a loop filter input signal LFin. The charge pump 200 may increase the level of the loop filter input signal LFin in proportion to the pulse width of the up signal UP and decrease the level of the loop filter input signal LFin in proportion to the pulse width of the down signal DN. The term level may refer to a voltage level.

The loop filter 300 may receive a loop filter input signal LFin and generate a loop filter output signal LFout. The loop filter 300 may generate a loop filter output signal LFout by filtering the noise frequency of the loop filter input signal LFin. The loop filter 300 may be a second-order low pass filter or a third-order low pass filter. However, the disclosure is not limited thereto, and as such, according to another embodiment, the loop filter 300 may include at least one resistor or at least one capacitor. A loop filter impedance $Z_{LF}$ may be determined depending on the resistance value of at least one resistor and the capacitance value of at least one capacitor. According to another embodiment, other components, such as, a passive component, an active component, an inductor etc., may be include in the loop filter 300.

The voltage control oscillator (VCO) 400 may receive the loop filter output signal LFout and generate a clock signal CK having a frequency adjusted depending on the voltage level of the loop filter output signal LFout.

The divider 500 may generate the feedback clock signal FEED_CK by dividing the frequency of the clock signal CK.

In an example case in which the reference clock signal REF_CK is faster than the feedback clock signal FEED_CK, the voltage level of the loop filter output signal LFout may be relatively high due to the up signal UP. With a relatively high loop filter output signal LFout, the voltage controlled oscillator 400 may generate a clock signal CK having a relatively high frequency. Accordingly, the frequency of the feedback clock signal FEED_CK increases and the phase of the feedback clock signal FEED_CK becomes faster, so the phase difference between the reference clock signal REF_CK and the feedback clock signal FEED_CK may be corrected.

In an example case in which the reference clock signal REF_CK is slower than the feedback clock signal FEED_CK, the voltage level of the loop filter output signal LFout may be relatively low due the down signal DN. With a relatively low loop filter output signal LFout, the voltage controlled oscillator 400 may generate a clock signal CK with a relatively low frequency. Accordingly, the frequency of the feedback clock signal FEED_CK is reduced and the phase of the feedback clock signal FEED_CK is slowed, so the phase difference between the reference clock signal REF_CK and the feedback clock signal FEED_CK may be corrected.

According to an embodiment, the phase locked loop circuit 1 may include a lock detector 110. The lock detector 110 may generate a lock detection signal LDS based on the phase difference between the reference clock signal REF_CK and the feedback clock signal FEED_CK. For example, the lock detector 110 may detect a point in time when the phase difference between the reference clock signal REF_CK and the feedback clock signal FEED_CK is equal to the reference value and activate a lock detection signal LDS at the detected point in time. The loop filter 300 may control the loop filter impedance $Z_{LF}$ based on the lock detection signal LDS.

In an embodiment, the phase-frequency detector 100 may generate the up signal UP and the down signal DN using different phase gains, depending on whether the phase difference between the reference clock signal REF_CK and the feedback clock signal FEED_CK is greater than the reference value. Therefore, as the phase gain of the phase-frequency detector 100 changes, a spurious frequency component included in the loop filter input signal LFin may be different. For example, the spurious frequency component may be an erroneous or error frequency component.

According to an embodiment, the loop filter 300 may improve filtering performance for spurious frequencies when the phase gain of the phase-frequency detector 100 is changed by controlling the loop filter impedance $Z_{LF}$ based on the lock detection signal LDS.

Figure 2:
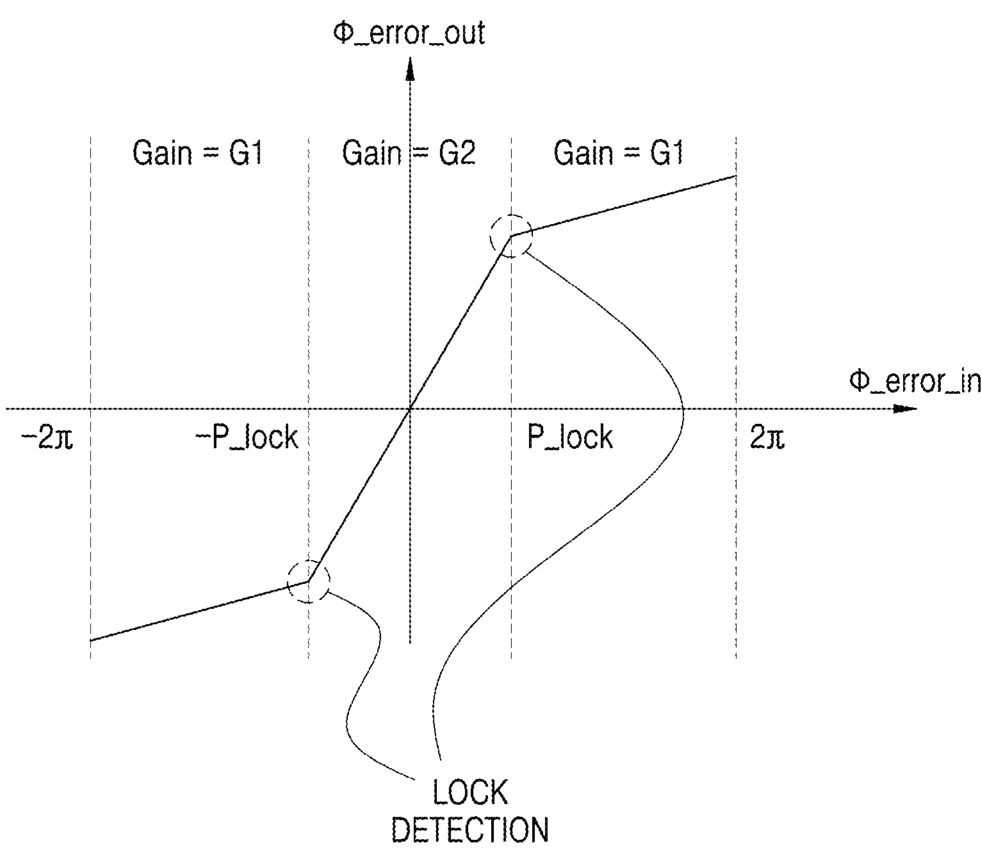
FIG. 2 is a diagram for explaining phase gain according to an embodiment.

FIG. 2 is a diagram for explaining phase gain according to an embodiment. FIG. 2 may be explained with reference to FIG. 1.

Referring to FIG. 2, the phase difference between the reference clock signal REF_CK and the feedback clock signal FEED_CK may be referred to as the input phase difference Φ_error_in and the phase difference between the up signal UP and the down signal DN may be referred to as the output phase difference Φ_error_out.

In an example case in which the input phase difference Φ_error_in is a value between P_lock and 2π, the phase gain may be G1. In an example case in which the input phase difference Φ_error_in is a value between −P_lock and P_lock, the phase gain may be G2. In an example case in which the input phase difference Φ_error_in is a value between −P_lock and −2π, the phase gain may be G1. For example, G1 may be 1, and G2 may be K+1 (K is a natural number). As described above with reference to FIG. 1, in an example case in which the phase gain is large, the voltage level of the loop filter output signal LFout also becomes large, so the frequency of the clock signal CK may be quickly corrected. That is, in an example case in which the input phase difference Φ_error_in is a value between −P_lock and P_lock, the phase difference between the reference clock signal REF_CK and the feedback clock signal FEED_CK may be corrected relatively quickly. In an example case in which the input phase difference Φ_error_in is a value between −2π and −P_lock or a value between P_lock and 2π, the phase difference between the reference clock signal REF_CK and the feedback clock signal FEED_CK may be corrected relatively slowly.

While the phase between the reference clock signal REF_CK and the feedback clock signal FEED_CK is corrected, the input phase difference Φ_error_in may gradually converge to 0 as the clock signal CK is repeatedly transmitted through the feedback path.

In an example case in which the phase gain of the phase-frequency detector 100 changes while the phase is being corrected, the open loop gain or closed loop gain of the phase locked loop circuit 1 changes, so the lock time for the clock signal CK to stabilize may increase.

The lock detector 110 may detect when the phase gain changes and may adjust the impedance $Z_{LF}$ of the loop filter 300 based on the change in the phrase gain. For example, the lock detector 110 may detect a time point at which the phase gain changes and adjust the impedance $Z_{LF}$ of the loop filter 300 at the time point to reset the overall gain of the phase-locked loop circuit 1, thereby shortening the lock time.

Figure 3:
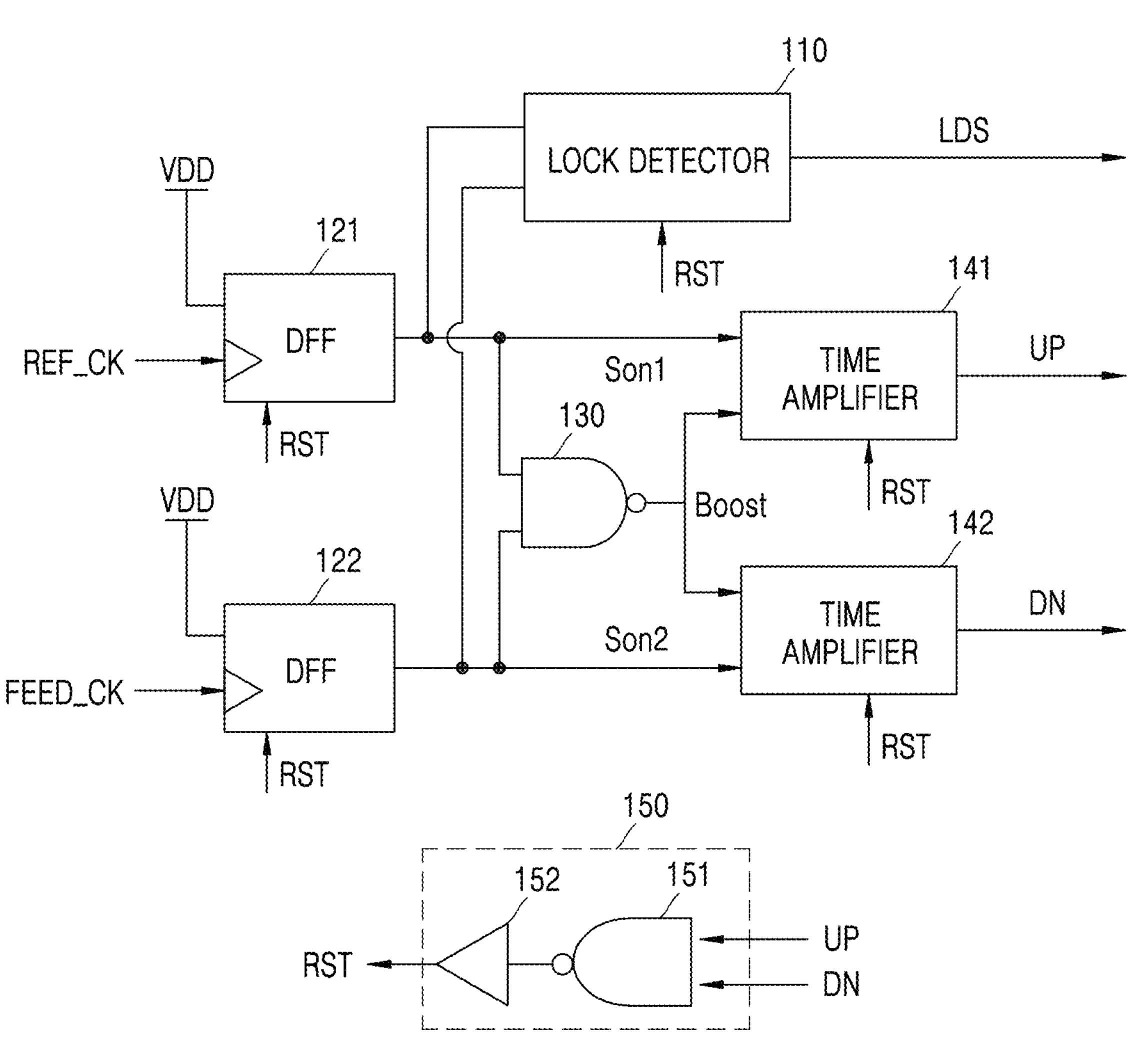
FIG. 3 is a circuit diagram illustrating a phase-frequency detector according to an embodiment.

FIG. 3 is a circuit diagram illustrating a phase-frequency detector 100 according to an embodiment.

Referring to FIG. 3, the phase-frequency detector 100 may include a lock detector 110, a first flip-flop (DFF) 121, a second flip-flop (DFF) 122, a boost signal generation circuit 130, a first time amplifier 141, a second time amplifier 142, and a reset signal generation circuit 150.

The lock detector 110 may receive a first input signal Son1, a second input signal Son2, and a reset signal RST and generate a lock detection signal LDS. The lock detector 110 may be described in detail with reference to FIG. 5.

The first flip-flop 121 may receive a reference clock signal REF_CK and generate a first input signal Son1 based on the reference clock signal REF_CK. For example, the first flip-flop 121 may generate the first input signal Son1 synchronized with the reference clock signal REF_CK. The first flip-flop 121 may sample the power supply voltage VDD at the rising edge of the reference clock signal REF_CK. Accordingly, the first input signal Son1 may have the same rising edge as the reference clock signal REF_CK. However, the disclosure is not limited thereto, and as such, according to another embodiment, the first flip-flop 121 may reset the first input signal Son1 to a deactivated state based on the reset signal RST.

The second flip-flop 122 may receive the feedback clock signal FEED_CK and generate a second input signal Son2 based on the feedback clock signal FEED_CK. For example, the second flip-flop 122 may generate the second input signal Son2 synchronized with the feedback clock signal FEED_CK. The second flip-flop 122 may sample the power supply voltage VDD at the rising edge of the feedback clock signal FEED_CK. Accordingly, the second input signal Son2 may have the same rising edge as the feedback clock signal FEED_CK. However, the disclosure is not limited thereto, and as such, according to another embodiment, the second flip-flop 122 may reset the second input signal Son2 to a deactivated state based on the reset signal RST.

The boost signal generation circuit 130 may generate a boost signal Boost based on the first input signal Son1 and the second input signal Son2. The boost signal Boost may be activated based on an occurrence of a phase difference occurs between the first input signal Son1 and the second input signal Son2. For example, the boost signal Boost may be activated in a phase error period and may be deactivated during other periods. According to an embodiment, the phrase error period may be a time period in which a phase difference occurs between the first input signal Son1 and the second input signal Son2 and the other periods may be time periods in which a phase difference does not occur between the first input signal Son1 and the second input signal. The boost signal generation circuit 130 may include a NAND circuit.

The first time amplifier 141 may generate an up signal UP based on the first input signal Son1, the boost signal Boost, and the reset signal RST. For example, the first time amplifier 141 may discharge the internal node (node V_CAP1 in FIG. 4) through a first discharge path (P1) and a second discharge path (P2) during the phase error period and may activate the up signal UP by discharging the internal node (V_CAP1 in FIG. 4) through the first discharge path (P1) during the other periods. According to an embodiment, the first time amplifier 141 may discharge the level of the internal node (node V_CAP1 in FIG. 4) to a first slew rate SR1 in the phase error period and may activate the up signal UP by discharging the level of the internal node (node V_CAP1 in FIG. 4) to a second slew rate SR2 in the other periods. As illustrated according to an embodiment in FIG. 6, the first slew rate SR1 may be greater than the second slew rate SR2. According to an embodiment, the first time amplifier 141 may activate the up signal UP by discharging the internal node (node V_CAP1 in FIG. 4) using the first and second discharge currents in the phase error period and discharging the internal node (node V_CAP1 in FIG. 4) using the first discharge current in other periods. The first time amplifier 141 may deactivate the up signal UP based on the reset signal RST.

The second time amplifier 142 may generate a down signal DN based on the second input signal Son2, the boost signal Boost, and the reset signal RST. The description of the first time amplifier 141 may be applied to the second time amplifier 142. For example, the second time amplifier 142 may discharge an internal node through a first discharge path and a second discharge path in the second time amplifier 142 during the phase error period and may activate the down signal DN by discharging the internal node through the first discharge path in the second time amplifier 142 during the other periods.

The reset signal generation circuit 150 receives the up signal UP and the down signal DN, and in an example case in which both the up signal UP and the down signal DN are activated, the reset signal RST may be deactivated. In detail, the reset signal generation circuit 150 may include a NAND circuit 151 and a buffer circuit 152. The NAND circuit 151 may perform a NAND operation on the up signal UP and down signal DN. The buffer circuit 152 may generate a reset signal RST by delaying the NAND operation result. Although one buffer circuit 152 is illustrated in FIG. 3, the disclosure is not limited thereto, and as such, according to another embodiment, the number of buffer circuits 152 may be more than one. The first and second input signals Son1 and Son2, up signal UP, and down signal DN may be reset to a deactivated state by the deactivated reset signal RST.

Figure 4:
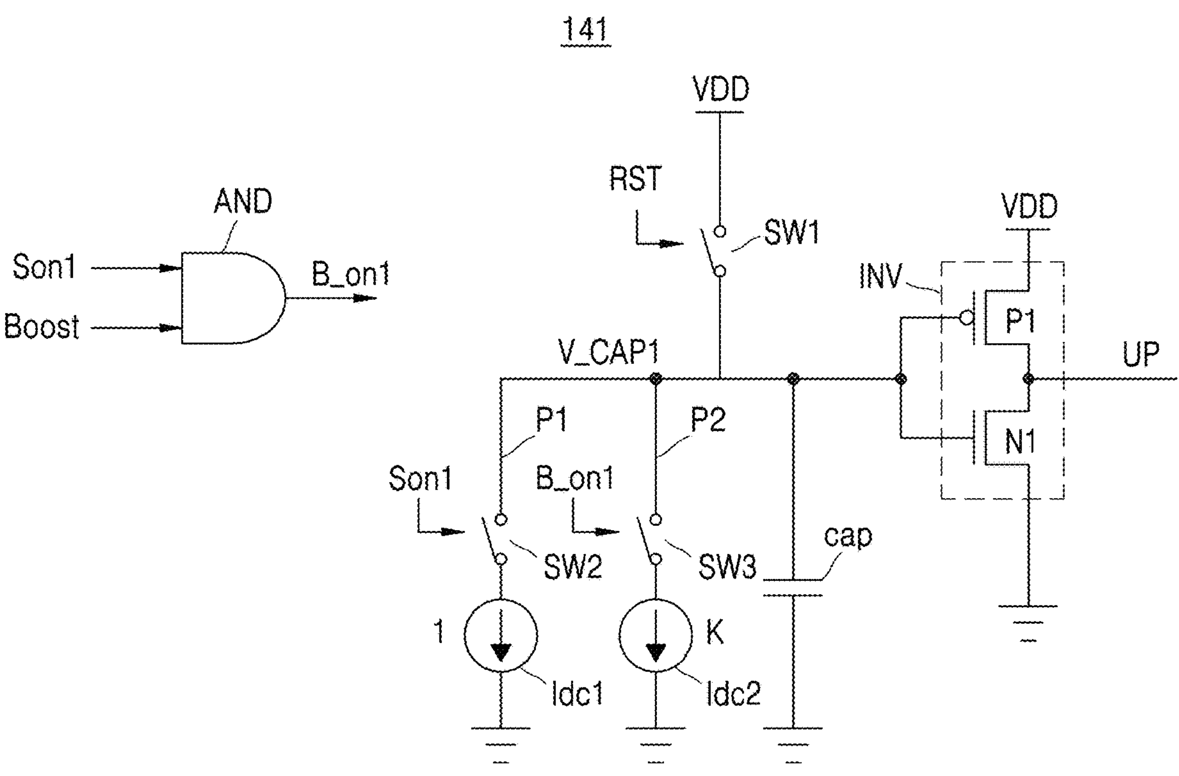
FIG. 4 is a circuit diagram of a first time amplifier according to an embodiment.

FIG. 4 is a circuit diagram of a first time amplifier 141 according to an embodiment. FIG. 4 may be explained with reference to FIG. 3. The description of the first time amplifier 141 may also be applied to the second time amplifier 142. For example, corresponding to the node V_CAP1 of the first time amplifier 141, the second time amplifier 142 may include a node V_CAP2. Moreover, similar to the first phase error signal B_on1 of the first time amplifier 141, the second time amplifier 142 may generate a second phase error signal B_on2.

Referring to FIG. 4, the first time amplifier 141 includes an input terminal connected to the node V_CAP1 and may include an inverter INV that outputs an up signal UP. The inverter INV may include an N-type transistor N1 and a P-type transistor P1.

The first time amplifier 141 may include a switch SW1 with one end connected to the power supply voltage VDD and the other end connected to the node V_CAP1. In an example case in which the reset signal RST is activated, the switch SW1 is turned on, the node V_CAP1 may be pre-charged, and the up signal UP may be deactivated by the inverter INV. The voltage precharged at the node V_CAP1 may be charged to the capacitor cap. One end of the capacitor cap may be connected to the node V_CAP1 and the other end of the capacitor cap may be connected to the ground node.

The first time amplifier 141 may discharge the node V_CAP1 through a first discharge path P1 and a second discharge path P2. The switch SW2 located on the first discharge path P1 may have one end connected to the node V_CAP1 and the other end connected to the ground node. In an example case in which the first input signal Son1 is activated, the switch SW2 is turned on and the node V_CAP1 may be discharged by the first discharge current Idc1 on the first discharge path P1. The switch SW3 located on the second discharge path P2 may have one end connected to the node V_CAP1 and the other end connected to the ground node. In an example case in which the first phase error signal B_on1 is activated, the switch SW3 may be turned on and the node V_CAP1 may be discharged by the second discharge current Idc2 on the second discharge path P2. The ratio between the magnitude of the first discharge current Idc1 and the magnitude of the second discharge current Idc2 may be 1:K. That is, the node V_CAP1 may be discharged faster by the second discharge current Idc2 than by the first discharge current Idc1.

The first time amplifier 141 may include an AND circuit that generates the first phase error signal B_on1. The first phase error signal B_on1 may be generated by performing an AND operation between the first input signal Son1 and the boost signal Boost. Accordingly, the first phase error signal B_on1 may be activated when the first input signal Son1 is activated but the second input signal Son2 is not activated. That is, the first phase error signal B_on1 may be activated in a phase error period in which the first input signal is faster than the second input signal Son2. For example, the first phase error signal B_on1 may be activated in a phase error period in which the reference clock signal REF_CK is faster than the feedback clock signal FEED_CK. The second time amplifier 142 may include an AND circuit that generates the second phase error signal B_on2. The second phase error signal B_on2 may be activated in a phase error period in which the second input signal Son2 (or feedback clock signal FEED_CK) is faster than the first input signal Son1 (or reference clock signal REF_CK) by the AND circuit included in the second time amplifier 142.

Figure 5:
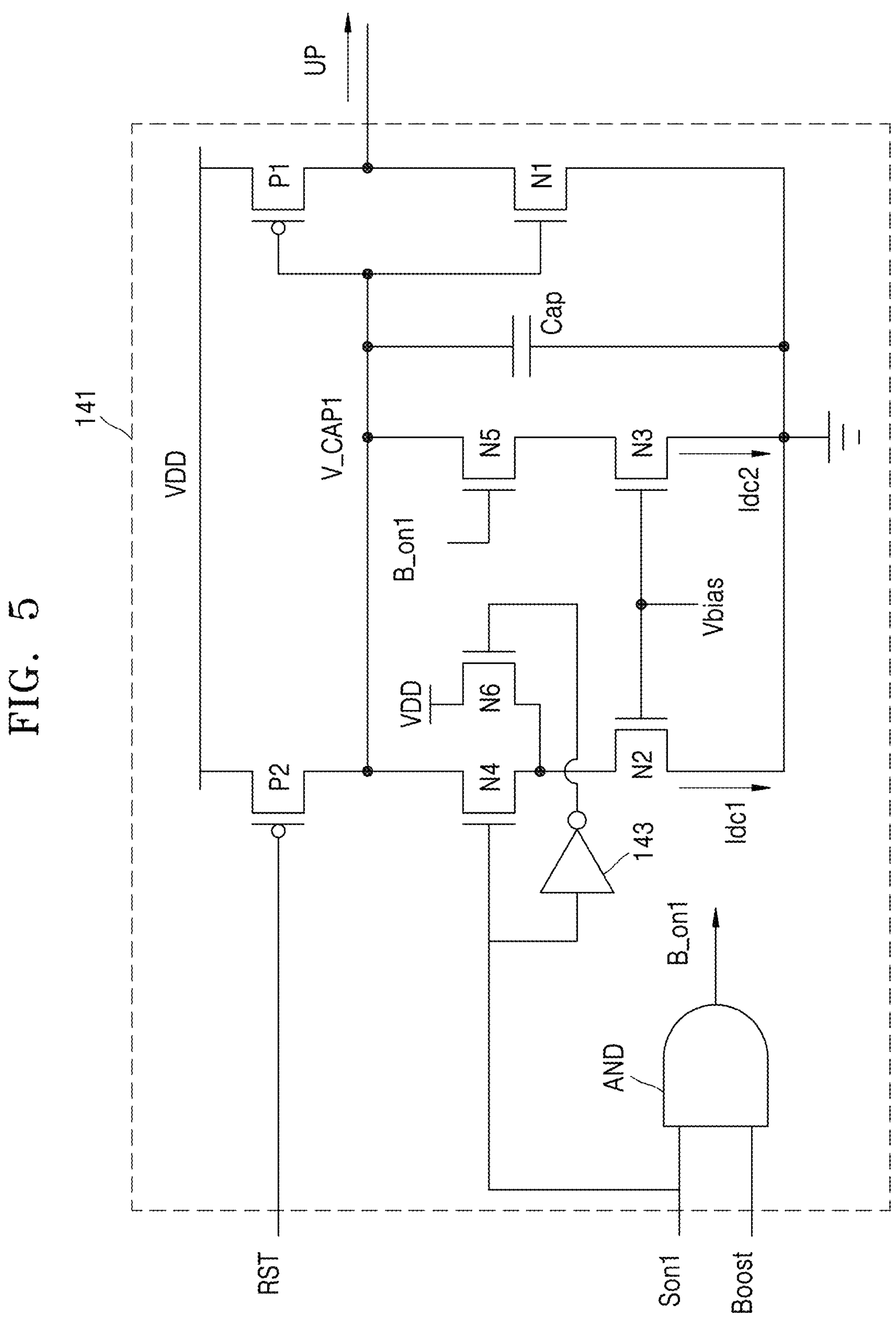
FIG. 5 is a detailed circuit diagram of a first time amplifier according to an embodiment.

FIG. 5 is a detailed circuit diagram of a first time amplifier 141 according to an embodiment. FIG. 5 may be explained with reference to FIG. 4. The description of the first time amplifier 141 may also be applied to the second time amplifier 142.

Referring to FIG. 5, the P-type transistor P2 may correspond to the switch SW1 in FIG. 4. The P-type transistor P2 may precharge the node V_CAP1 when the reset signal RST is disabled. That is, in an example case in which the reset signal RST is deactivated, the up signal UP may be reset to a deactivated state.

A bias voltage Vbias may be applied to the gate terminals of the N-type transistors N2 and N3. The first discharge current Idc1 flowing through the N-type transistor N2 may discharge the node V_CAP1, and the second discharge current Idc2 flowing through the N-type transistor N3 may discharge the node V_CAP1.

The N-type transistor N4 may correspond to the switch SW2 in FIG. 4. A first input signal Son1 may be provided to the gate terminal of the N-type transistor N4, and based on the first input signal Son1 being activated, the N-type transistor N4 may be turned on, thereby forming a first discharge path.

The N-type transistor N5 may correspond to the switch SW3 in FIG. 4. A first phase error signal B_on1 may be provided to the gate terminal of the N-type transistor N5, and based on the first phase error signal B_on1 being activated, the N-type transistor N5 may be turned on, thereby forming a second discharge path.

According to an embodiment, the first time amplifier 141 may further include an N-type transistor N6 connected in parallel with the N-type transistor N4. The source terminal of the N-type transistor N6 may be connected to the source terminal of the N-type transistor N4, the drain terminal of the N-type transistor N6 may be connected to the power supply voltage VDD, and the gate terminal of the N-type transistor N6 may be connected to the output of the inverter 143. The inverter 143 may invert the first input signal Son1 and output the inverted first input signal Son1. That is, according to an embodiment, even if the first input signal Son1 is in an inactive state, the first discharge path may be formed by the N-type transistor N6.

Figure 6:
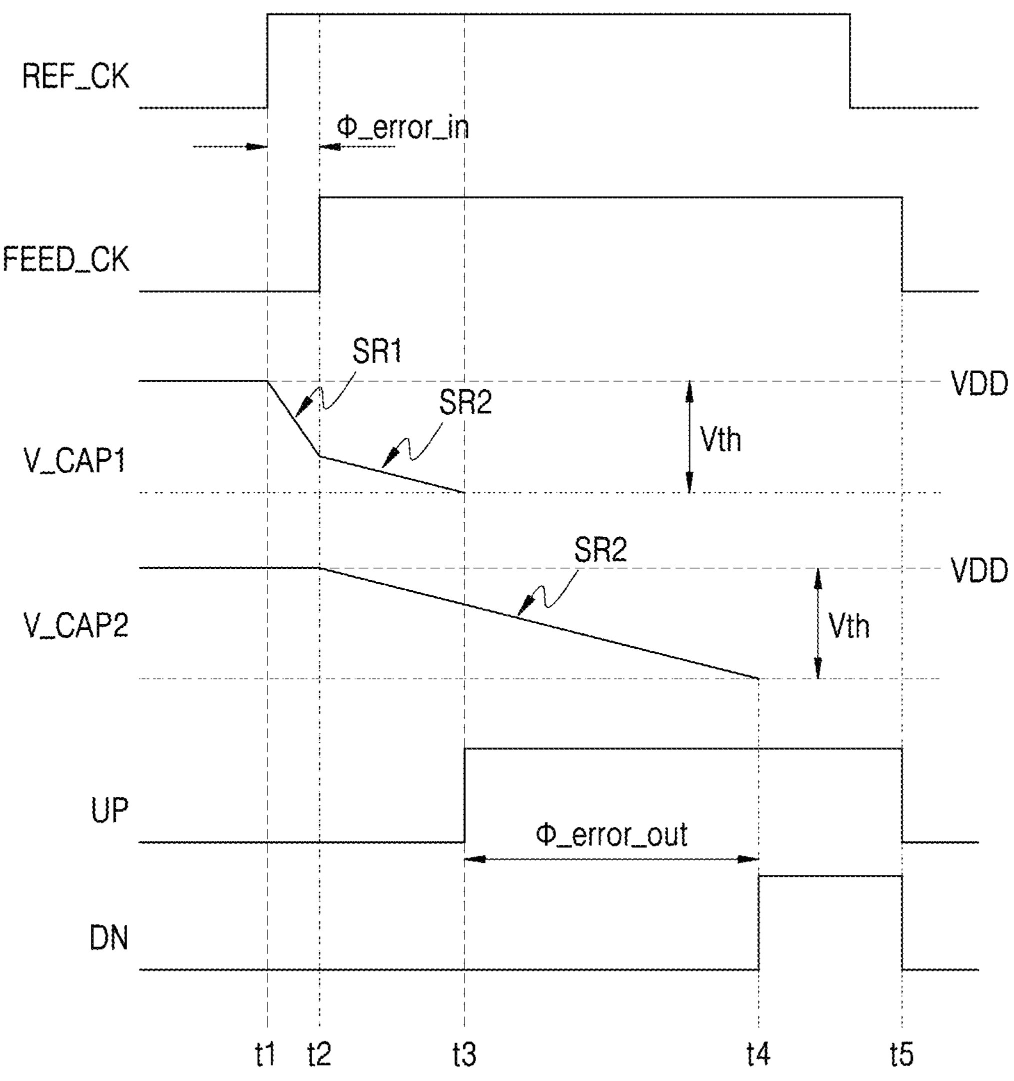
FIG. 6 is a timing diagram for explaining the operation of a phase-frequency detector according to an embodiment.

FIG. 6 is a timing diagram for explaining the operation of a phase-frequency detector 100 according to an embodiment. FIG. 6 may be explained with reference to FIGS. 3 to 5. In FIG. 6, the voltage at Node V_CAP1 and the Node V_CAP2 are initially shown to be precharged to the VDD level. However, the disclosure is not limited thereto, and as such, the initial voltage level of the Node V_CAP1 and Node V_CAP2 may vary depending on the capacity of the capacitor Cap.

Referring to FIG. 6, at the first time t1, the reference clock signal REF_CK may transition to the active state. Referring to FIG. 3, in an example case in which the reference clock signal REF_CK is activated, the first flip-flop 121 may transition the first input signal Son1 to the active state by sampling the power supply voltage VDD. For example, the first input signal Son1 may have the same activation timing as the reference clock signal REF_CK.

At the second time t2, the feedback clock signal FEED_CK may transition to the active state. Referring to FIG. 3, in an example case in which the feedback clock signal FEED_CK is activated, the second flip-flop 122 may transition the second input signal Son2 to the active state by sampling the power supply voltage VDD. For example, the second input signal Son2 may have the same activation timing as the feedback clock signal FEED_CK.

The phase of the reference clock signal REF_CK may be faster than the phase of the feedback clock signal FEED_CK, and the input phase difference between the reference clock signal REF_CK and the feedback clock signal FEED_CK may be Φ_error_in. The time interval between the first time t1 and the second time t2 may be a phase error period.

Referring to FIGS. 4 to 6, in the time interval between the first time t1 and the second time t2, the first input signal Son1 is in an active state and the second input signal Son2 is in an inactive state, so the first phase error signal B_on1 may be in an active state. Accordingly, the first discharge current Idc1 and the second discharge current Idc2 may be discharged from the node V_CAP1. As shown in FIG. 6, in the time interval between the first time t1 and the second time t2, the node V_CAP1 may be discharged depending on the first slew rate SR1.

Referring to FIGS. 4 and 6, in the time interval between the first time t1 and the second time t2, the second input signal Son2 is in an inactive state, and as such, a discharge path for the node V_CAP2 may not be formed and the voltage level of the node V_CAP2 may be maintained at the power supply voltage VDD.

In an example case in which the feedback clock signal FEED_CK transitions to the active state at the second time t2, the boost signal Boost may transition to the inactive state by the boost signal generation circuit 130 of FIG. 3. As the first phase error signal B_on1 transitions to an inactive state by the AND circuit of FIG. 4, the switch SW3 is turned off, thereby blocking the second discharge path. Accordingly, because the node V_CAP1 is discharged only by the first discharge current Idc1 on the first discharge path, the discharge speed (or the magnitude of discharge) may be slower than a case in which both the first and the second discharge paths are turned on. Accordingly, the node V_CAP1 may be discharged depending on the second slew rate SR2. The second slew rate SR2 may be less than the first slew rate SR1.

According to an embodiment, because the feedback clock signal FEED_CK transitions to the active state at the second time t2, the node V_CAP2 may be discharged by the first discharge current Idc1. That is, the node V_CAP2 may be discharged depending on the second slew rate SR2.

At the third time t3, the voltage level of the Node V_CAP1 may be lowered by the threshold voltage Vth of the P-type transistor P1 in FIG. 5. Accordingly, in the first time amplifier 141, the P-type transistor P1 is turned on and the up signal UP may transition to the active state.

At the fourth time t4, the voltage level of the Node V_CAP2 may be lowered by the threshold voltage Vth of the P-type transistor P1 included in the second time amplifier 142. Accordingly, in the second time amplifier 142, the P-type transistor P1 is turned on and the down signal DN may transition to an active state.

The phase of the up signal UP may be faster than the phase of the down signal DN, and the phase difference between the up signal UP and the down signal DN may be Φ_error_out.

According to an embodiment, in a case in which both the up signal UP and the down signal DN are activated, when a certain delay time elapses after the down signal DN is activated, the reset signal RST may be deactivated by the reset signal generation circuit 150 of FIG. 3. Accordingly, the first input signal Son1, the second input signal Son2, the up signal UP, and the down signal DN may all be reset to a deactivated state. For a time period between the fourth time t4 and the fifth time t5, the voltage level of nodes V_CAP1 and V_CAP2 may reach to the power supply voltage VDD.

Figure 7A:
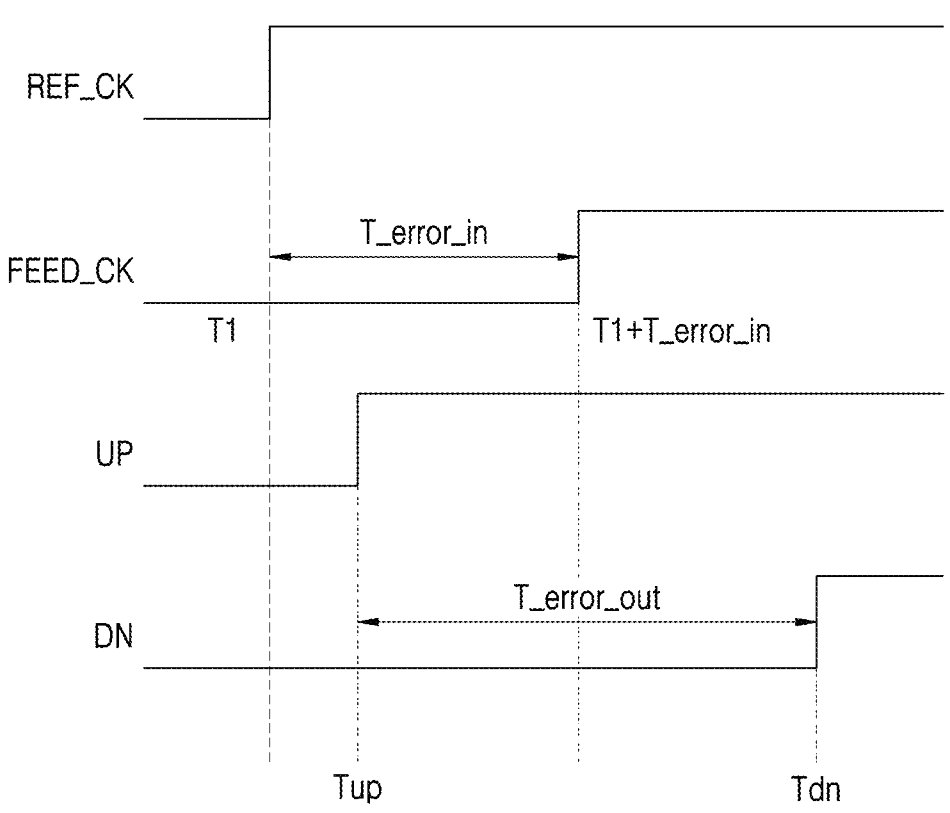
FIGS. 7A and 7B are timing diagrams for explaining the relationship between an input phase difference and an output phase difference.
Figure 7B:
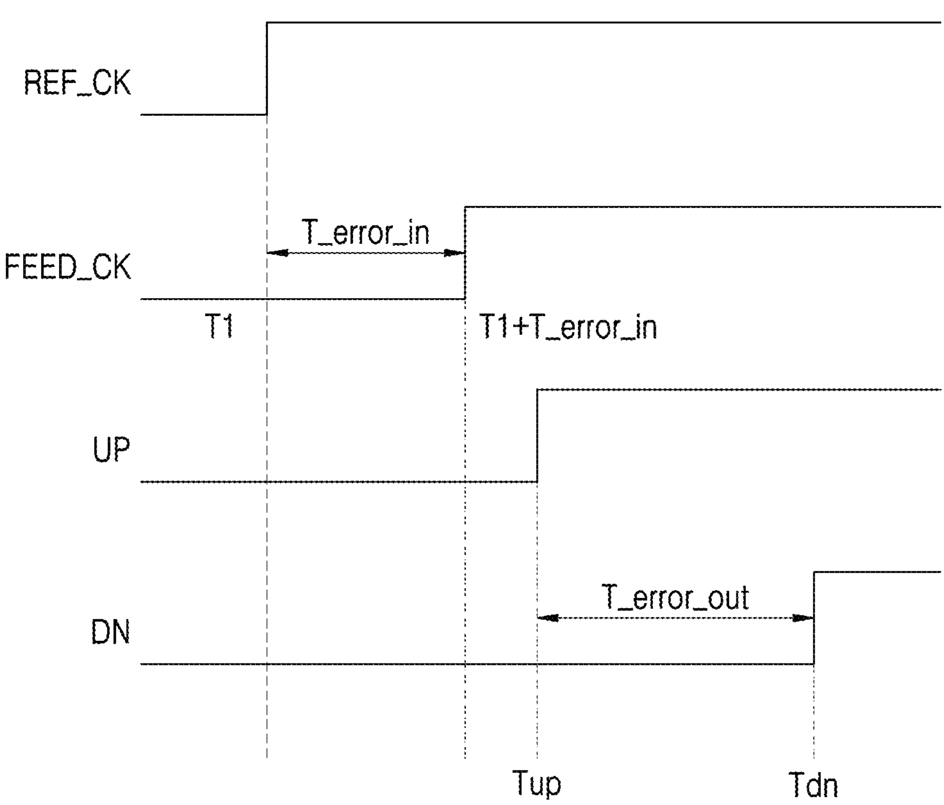

FIGS. 7A and 7B are timing diagrams for explaining the relationship between an input phase difference and an output phase difference.

In FIGS. 7A and 7B, the timing difference between an edge of a reference clock signal REF_CK and an edge of a feedback clock signal FEED_CK may be referred to as the input error time T_error_in. The timing difference between an edge of the up signal UP and an edge of the down signal DN may be referred to as an output error time T_error_out. In FIGS. 7A and 7B, the input error time T_error_in may be longer than the time for the voltage level of the Node V_CAP1 to drop by a threshold voltage Vth in FIG. 6.

FIG. 7A is a timing diagram illustrating a case where the phase of the reference clock signal REF_CK is faster than the phase of the feedback clock signal FEED_CK by more than a reference phase (e.g., P_lock in FIG. 2).

Therefore, unlike the case illustrated in FIG. 6, in which the level of the Node V_CAP1 decreases by Vth as the Node V_CAP1 is discharged depending on a first slew rate SR1 between the first time t1 and the second time t2 and discharged depending on the second slew rate SR2 between the second time t2 and the third time t3, the level of the Node V_CAP1 may decrease by Vth as the Node V_CAP1 is discharged depending on the first slew rate SR1 in FIG. 7A. That is, in an example case in which the Node V_CAP1 is discharged only by the first discharge current Idc1 and the second discharge current Idc2 during the input error time T_error_in, the time Tup at which the up signal UP is activated may be calculated as in Equation 1.

$$Tup = T1 + \frac{C \times Vth}{(1+k)I} \quad \text{[Equation 1]}$$

Here, Vth may represent the reduced voltage level of the node V_CAP1, C may represent the capacitance of the capacitor Cap, I may represent the magnitude of the first discharge current Idc1, and kI may represent the magnitude of the second discharge current Idc2. Here, kI may be derived from multiplying I*(1+k).

The Node V_CAP2 may be discharged from T1+T_error_in in an example case in which the feedback clock signal FEED_CK is activated, and is discharged only by the first discharge current Idc1, so the time Tdn when the down signal DN is activated may be calculated as Equation 2.

$$Tdn = T1 + \text{T\_error\_in} + \frac{C \times Vth}{I} \quad \text{[Equation 2]}$$

According to Equation 1 and Equation 2, the output error time T_error_out may be calculated as Equation 3.

$$\text{T\_error\_out} = Tdn - Tup = \text{T\_error\_in} + \frac{C \times Vth}{I}\left(1 - \frac{1}{1+k}\right) \quad \text{[Equation 3]}$$

According to Equation 3, because the output error time T_error_out is not amplified by the input error time T_error_in, the phase gain may be 1. That is, G1 in FIG. 2 may be 1.

FIG. 7B is a timing diagram illustrating a case where the phase of the reference clock signal REF_CK is faster than the feedback clock signal FEED_CK by less than or equal to the reference phase (e.g., P_lock in FIG. 2).

That is, because the input error time T_error_in is short, even if the Node V_CAP1 is discharged by the first discharge current Idc1 and the second discharge current Idc2 during the input error time T_error_in, the voltage level of the Node V_CAP1 may only drop by a level Ve that is smaller than the threshold voltage Vth. Referring to FIGS. 6 and 7B, at the first time t1 and the second time t2, the level of the Node V_CAP1 may drop by Ve. After the voltage level of the Node V_CAP1 drops by Ve, the Node V_CAP1 is discharged by the first discharge current Idc1 for a period of time Tm, thereby causing the voltage to drop by the total threshold voltage Vth level. Tm may be the time between the second time t2 and the third time t3 in FIG. 6. Accordingly, the time Tup at which the up signal UP is activated may be calculated by Equation 4 and Equation 5.

$$T\_error\_in = \frac{C \times Ve}{(1+k)I} \quad \text{[Equation 4]}$$

$$Tup = T1 + T\_error\_in + \frac{C \times (Vth - Ve)}{I} \quad \text{[Equation 5]}$$

The Node V_CAP2 may be discharged starting from T1+T_error_in in an example case in which the feedback clock signal FEED_CK is activated, and because the Node V_CAP2 is discharged only by the first discharge current Idc1, the time when the down signal DN is activated may be calculated as in Equation 6.

$$Tup = T1 + T\_error\_in + \frac{C \times Vth}{I} \quad \text{[Equation 6]}$$

According to Equation 5 and Equation 6, the output error time T_error_out may be calculated as in Equation 7.

$$T\_error\_out = Tdn - Tup = \frac{C \times Ve}{I} = \frac{C}{I} \times \frac{(1+k)I \times T\_error\_in}{C} = (1+k)T\_error\_in \quad \text{[Equation 7]}$$

Because the output error time T_error_out is amplified by (1+k) times the input error time T_error_in, the phase gain may be 1+k. That is, G2 in FIG. 2 may be 1+k.

Referring to FIGS. 7A and 7B, in an example case in which the voltage level of the Node V_CAP1 that drops during the input error time T_error_in is greater than the threshold voltage Vth, the phase gain is 1, and the voltage level of the Node V_CAP1 that drops during the input error time T_error_in is less than the threshold voltage, the phase gain may be K+1. That is, in an example case in which the voltage level of the Node V_CAP1 that drops during the input error time T_error_in is equal to the threshold voltage Vth, the phase gain may be changed and the corresponding input error time T_error_in may be referred to as the gain change time Tgainchange.

As the phase-locked loop circuit 1 feeds back the clock signal CK, the phase error between the reference clock signal REF_CK and the feedback clock signal FEED_CK, that is, the input error time T_error_in, may be gradually reduced, and when the input error time T_error_in reaches the gain change time Tgainchange calculated by Equation 8 and Equation 9, the phase gain may be changed.

$$Ve = Vth = \frac{(1+k)I \times Tgainchange}{C} \quad \text{[Equation 8]}$$

$$Tgainchange = \frac{C \times Vth}{(1+k)I} \quad \text{[Equation 9]}$$

FIG. 8 is a circuit diagram illustrating a lock detector 110 according to an embodiment. FIG. 8 may be described with reference to FIG. 4.

Referring to FIG. 8, the lock detector 110 may include a time amplifier replication circuit 111, an OR circuit 112, a third flip-flop 113, a fourth flip-flop 116, a counter 114, a compare circuit 115, and a buffer circuit 117.

The time amplifier replication circuit 111 may have the same structure as the first time amplifier 141 of FIG. 4. In detail, the time amplifier replication circuit 111 may include an inverter including an N-type transistor N2 and a P-type transistor P2. The input node of the inverter may be referred to as Nin and the output node of the inverter may be referred to as Nout.

Like the switch SW1 in FIG. 4, the switch SW4 may precharge the node Nin by switching based on the reset signal RST. The precharged voltage may be charged to a capacitor cap. In an example case in which the level of the node Nin is a logic high level, the level of the node Nout may have a logic low level indicating an inactive state by the inverter.

The third discharge current Idc3 of FIG. 8 may correspond to the sum of the first discharge current Idc1 and the second discharge current Idc2 of FIG. 4. The size of the third discharge current Idc3 may be (K+1) I. As described above with reference to FIGS. 7A and 7B, when node Nin is discharged using a discharge current of (1+K) I, in an example case in which the input error time T_error_in is shorter than the gain change time Tgainchange, because the node Nin is not discharged enough to turn on the P-type transistor P2, the level of the node Nout may remain at a logic low level. On the other hand, in an example case in which the input error time T_error_in is longer than the gain change time Tgainchange, the node Nin is discharged enough to turn on the P-type transistor P2, so the level of the node Nout may transition to a logic high level. That is, early in operation of the phase-locked loop circuit 1, the input error time T_error_in may be longer than the gain change time Tgainchange, so the node Nout may be maintained at a logic low level. As phase correction is repeatedly performed by the phase-locked loop circuit 1, the length of the input error time T_error_in gradually decreases, and the node Nout can transition to a logic high level which means that the input error time T_error_in reaches the gain change time Tgainchange.

The switches SW2 and SW3 in FIG. 4 may be shown as a switch SW5 in FIG. 8. Unlike the switches SW2 and SW3, the switch SW5 may be turned on based on the OR operation result of the first input signal Son1 and the second input signal Son2. The OR circuit 112 may perform an OR operation on the first and second input signals Son1 and Son2 and switch the switch SW5 based on the result of the OR operation. Accordingly, in an example case in which one of the first input signal Son1 and the second input signal Son2 is activated, the node Nin may be discharged by a discharge current corresponding to the size of (K+1) I. That is, regardless of which clock signal has a faster phase between the reference clock signal REF_CK and the feedback clock signal FEED_CK, in the phase error period, the node Nin may be discharged by a discharge current corresponding to the size of (K+1) I.

The third flip-flop 113 may sample the level of the node Nout by synchronizing with the falling edge of the OR operation result of the first input signal Son1 and the second input signal Son2 and provide the sampling value to the counter 114.

While the phase locked loop circuit 1 stabilizes the frequency of the clock signal CK, the input phase difference between the reference clock signal REF_CK and the feedback clock signal FEED_CK generally decreases, but the input phase difference may temporarily increase due to noise, etc. Therefore, the lock detector 110 may prevent an impedance of the loop filter 300 from changing when the level of node Nout changes due to temporary noise by monitoring the level of node Nout for more than a reference time.

In detail, the counter 114 may count the sampling value of the third flip-fop 113 by synchronizing with the reference clock signal REF_CK. The comparison circuit 115 may compare the count value and the reference value and activate the output value when the count value exceeds the reference value.

The buffer circuit 117 may delay the activated output value and provide the delayed output value as a clock signal to the fourth flip-flop 116. The fourth flip-flop 116 may generate a lock detection signal LDS by sampling the corresponding output value.

Figure 9:
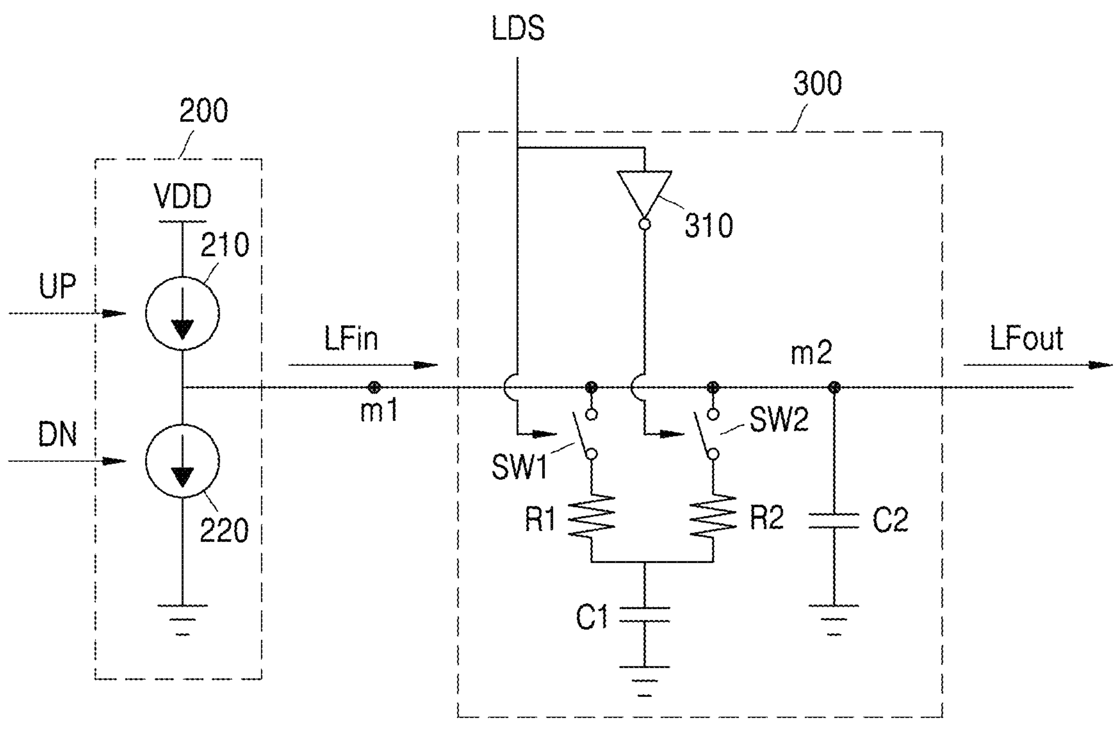
FIG. 9 is a circuit diagram illustrating a charge pump and a loop filter according to an embodiment.

FIG. 9 is a circuit diagram illustrating a charge pump 200 and a loop filter 300 according to an embodiment. FIG. 9 may be explained with reference to FIGS. 3 and 8.

Referring to FIG. 9, the charge pump 200 may include a precharge circuit 210 and a discharge circuit 220. The precharge circuit 210 may increase the level of the loop filter input signal LFin by precharging node m1 based on the up signal UP. The discharge circuit 220 may reduce the level of the loop filter input signal LFin by discharging node m2 based on the down signal DN.

The loop filter 300 may generate a loop filter output signal LFout by filtering the loop filter input signal LFin.

The loop filter 300 may include resistors R1 and R2, capacitors C1 and C2, switches SW1 and SW2, and an inverter 310. One end of the capacitor C2 may be connected to the node m2 and the other end may be connected to the ground node. The impedance $Z_{LF}$ of FIG. 1 may be determined by the resistors R1 and R2 and capacitors C1 and C2.

The switch SW1 may be connected in series with the resistor R1 and may switch between the node m2 and the capacitor C1. Switch SW2 may be connected in series with resistor R2 and may switch between the node m2 and capacitor C1. One end of the capacitor C1 may be connected to the resistors R1 and R2, and the other end of the capacitor C1 may be connected to the ground node.

The switch SW1 may be switched by the lock detection signal LDS, and the switch SW2 may be switched by an inverted value of the lock detection signal LDS.

Referring to FIGS. 2 and 9, the loop filter 300 may change the impedance $Z_{LF}$ of the loop filter 300 based on the lock detection signal LDS. In detail, in an example case in which the phase gain is changed in the phase-frequency detector 100, the open-loop gain of the phase-locked loop circuit 1 is also changed, so the lock time for stabilizing the clock signal CK may increase. Accordingly, the loop filter 300 may keep the open-loop gain of the phase-locked loop circuit 1 constant by changing the impedance $Z_{LF}$ when the phase gain of the phase-frequency detector 100 changes.

According to an embodiment, referring to FIG. 2, the total resistance value of the resistors R1 and R2 when the phase gain is G1 may be lower than the total resistance value of the resistors R1 and R2 when the phase gain is G2. For example, in an example case in which the phase gain is G1, the lock detection signal LDS may be at a logic low level, the switch SW1 may be turned off, and the switch SW2 may be turned on. In an example case in which the phase gain is G2, the lock detection signal LDS is at a logic high level, the switch SW1 may be turned on, and the switch S2 may be turned off. Therefore, in an example case in which the phase gain is G1, the total resistance value of the loop filter 300 is equal to the resistance value of R1, and in an example case in which the phase gain is G2, the total resistance value of the loop filter 300 is equal to the resistance value of R2. The resistance value of R1 may be less than that of R2.

However, the disclosure is not limited thereto, and as such, the number of resistors, the structure of the loop filter 300, the position of a switch, etc. may be different. For example, the number of resistors, the structure of the loop filter 300, the position of a switch, etc., may be varied or changed so that the total resistance value of the loop filter 300 when the phase gain is G1 is lower than the total resistance value of the loop filter 300 when the phase gain is G2.

In this specification, embodiments have been described using specific terms, but this is only used for the purpose of explaining the technical idea of the disclosure and is not used to limit the meaning or scope of the disclosure as set forth in the claims.

While the disclosure has been particularly shown and described with reference to embodiments thereof, it will be understood that various changes in form and details may be made therein without departing from the spirit and scope of the following claims.

What is claimed is:

1. A phase locked loop circuit comprising:

a phase-frequency detection circuit configured to:

receive a reference clock signal and a feedback clock signal, adjust a phase gain from a first value to a second value in response to a phase difference between the reference clock signal and the feedback clock signal being less than a reference value, and generate a first control signal and a second control signal based on the phase gain;

a lock detection circuit configured to generate a lock detection signal that is activated in response to the phase gain having the second value;

a charge pump circuit configured to generate a loop filter input signal by precharging an output node based on the first control signal and discharging the output node based on the second control signal;

a loop filter comprising at least one resistor, at least one capacitor, and a first switch connected in series with the at least one resistor, the loop filter configured to:

adjust impedance by switching the first switch based on the activated lock detection signal, and generate a loop filter output signal by filtering the loop filter input signal based on the adjusted impedance;

an oscillator configured to generate a clock signal based on the loop filter output signal; and a divider configured to generate the feedback clock signal by dividing the clock signal.

2. The phase locked loop circuit of claim 1, wherein, based on the lock detection signal being in an inactive state, a resistance value of the at least one resistor has a first resistance value, wherein based on the lock detection signal being in an activated state, the resistance value of the at least one resistor has a second resistance value, and wherein the first resistance value is greater than the second resistance value.

3. The phase locked loop circuit of claim 1, wherein the phase-frequency detection circuit comprises:

a first flip-flop configured to generate a first input signal in synchronization with the reference clock signal;

a second flip-flop configured to generate a second input signal in synchronization with the feedback clock signal;

a first time amplifier configured to, based on the reference clock signal leading the feedback clock signal, discharge a first node based on a first discharge current and a second discharge current in a first period, discharge the first node based on the first discharge current in a second period different from the first period, and generate the first control signal based on the first node; and a second time amplifier configured to, based on the reference clock signal lagging the feedback clock signal, discharge a second node based on the first discharge current and the second discharge current in the first period, discharge the second node based on the first discharge current in the second period, and generate the second control signal based on the second node.

4. The phase locked loop circuit of claim 3, wherein the lock detection circuit is further configured to discharge a third node based on the first discharge current and the second discharge current and generate the lock detection signal based on a voltage level of the third node.

5. The phase locked loop circuit of claim 4, wherein the lock detection circuit further comprises:

an inverter configured to invert the voltage level of the third node;

a counter configured to count an activation time of an output signal of the inverter; and a comparison circuit configured to activate the lock detection signal based on a comparison between the activation time and a reference time.

6. The phase locked loop circuit of claim 5, wherein the reference value is a phase value corresponding to a time at which the voltage level of the third node decreases by a threshold voltage of a transistor in the inverter.

7. The phase locked loop circuit of claim 3, wherein the lock detection circuit has a same structure as the first time amplifier or the second time amplifier.

8. A method of operating a phase-locked loop circuit, the method comprising:

adjusting a phase gain from a first value to a second value in response to a phase difference between a reference clock signal and a feedback clock signal being less than a reference value;

generating a first control signal and a second control signal based on the adjusted phase gain;

generating a lock detection signal based on the phase difference, the lock detection signal being activated in response to the phase gain having the second value and the lock detection signal being deactivated in response to the phase gain having the first value;

generating a loop filter input signal by precharging an output node based on the first control signal and discharging the output node based on the second control signal;

adjusting an impedance of a loop filter by switching a first switch connected in series with a resistor of the loop filter based on the lock detection signal;

generating a loop filter output signal by filtering the loop filter input signal based on the adjusted impedance; and generating a clock signal based on the loop filter output signal.

9. The method of claim 8, wherein the adjusting of the impedance of the loop filter comprises reducing a resistance value included in the loop filter based on the activated lock detection signal.

10. The method of claim 8, further comprising:

discharging a first node through a first discharge path and a second discharge path in a first period in which the reference clock signal leads the feedback clock signal;

discharging the first node through the first discharge path in a second period different from the first period;

generating the first control signal further based on the first node;

discharging a second node through the first discharge path and the second discharge path in the first period in which the reference clock signal lags the feedback clock signal;

discharging the second node through the first discharge path in the second period; and generating the second control signal further based on the second node.

11. The method of claim 10, wherein the generating of the lock detection signal further comprises discharging a third node through the first discharge path and the second discharge path and generating the lock detection signal based on a voltage level of the third node.

12. The method of claim 11, wherein the generating of the lock detection signal comprises:

generating an output signal by inverting the voltage level of the third node;

counting an activation time of the output signal; and activating the lock detection signal based on comparison between the activation time and a reference time.

13. The method of claim 12, wherein the reference value corresponds to a time at which the voltage level of the third node decreases by a threshold voltage of a transistor in an inverter that inverts the voltage level of the third node.

14. The method of claim 8, wherein the generating of the lock detection signal is performed based on a first circuit having a same structure as a second circuit generating the first control signal and the second control signal.

15. A phase locked loop circuit comprising:

a phase-frequency detection circuit configured to:

receive a reference clock signal and a feedback clock signal, adjust a phase gain from a first value to a second value in response to a phase difference between the reference clock signal and the feedback clock signal being less than a reference value, and generate a first control signal and a second control signal based on the phase gain;

a lock detection circuit configured to generate a lock detection signal that is activated in response to the phase gain having the second value;

a charge pump circuit configured to generate a loop filter input signal by precharging an output node based on the first control signal and discharging the output node based on the second control signal;

a loop filter comprising at least one resistor, at least one capacitor, and a first switch connected in series with the at least one resistor, the loop filter configured to:

adjust a resistance value of the at least one resistor or a capacitance value of the at least one capacitor by switching the first switch based on the lock detection signal, and generate a loop filter output signal by filtering the loop filter input signal based on the adjusted resistance value or the adjusted capacitance value; and an oscillator configured to generate a clock signal based on the loop filter output signal.

16. The phase locked loop circuit of claim 15, wherein, based on the lock detection signal being in an inactive state, a resistance value of the at least one resistor has a first resistance value, wherein, based on the lock detection signal being in an activated state, a resistance value of the at least one resistor has a second resistance value, and wherein the first resistance value is greater than the second resistance value.

17. The phase locked loop circuit of claim 15, wherein the phase-frequency detection circuit comprises a first flip-flop configured to generate a first input signal in synchronization with the reference clock signal;

a second flip-flop configured to generate a second input signal in synchronization with the feedback clock signal;

a first time amplifier configured to, based on the reference clock signal leading the feedback clock signal, discharge a first node based on a first discharge current and a second discharge current in a first period, discharge the first node based on the first discharge current in a second period, and generate the first control signal based on the first node; and a second time amplifier configured to, based on the reference clock signal lagging the feedback clock signal, discharge a second node based on the first discharge current and the second discharge current in the first period, discharge the second node based on the first discharge current in the second period, and generate the second control signal based on the second node.

18. The phase locked loop circuit of claim 17, wherein the lock detection circuit is further configured to discharge a third node based on the first discharge current and the second discharge current and generate the lock detection signal based on a voltage level of the third node.

19. The phase locked loop circuit of claim 18, wherein the lock detection circuit further comprises an inverter configured to invert the voltage level of the third node;

a counter configured to count an activation time of an output signal of the inverter; and a comparison circuit configured to activate the lock detection signal based on a comparison between the activation time and a reference time.

20. The phase locked loop circuit of claim 19, wherein the reference value is a phase value corresponding to a time at which the voltage level of the third node decreases by a threshold voltage of a transistor in the inverter.

* * * * *